United States Patent
Macerola et al.

(10) Patent No.: US 10,157,644 B1
(45) Date of Patent: Dec. 18, 2018

(54) METHODS AND APPARATUS FOR GENERATION OF VOLTAGES

(71) Applicant: MICRON TECHNOLOGY, INC., Boise, ID (US)

(72) Inventors: Agostino Macerola, San Benedetto dei Marsi (IT); Marco-Domenico Tiburzi, Avezzano (IT); Stefano Perugini, Popoli (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/671,317

(22) Filed: Aug. 8, 2017

(51) Int. Cl.
*G11C 5/14* (2006.01)
*G06F 1/32* (2006.01)
*G05F 3/16* (2006.01)

(52) U.S. Cl.
CPC ............ *G11C 5/145* (2013.01); *G05F 3/16* (2013.01); *G06F 1/3203* (2013.01); *G06F 1/3275* (2013.01); *G11C 5/147* (2013.01)

(58) Field of Classification Search
CPC .......... G11C 5/145; G11C 5/146; G05F 3/16; G05F 3/18; G05F 3/185; G05F 3/20; G05F 3/205; G05F 3/22; G05F 3/222; G05F 3/225; G05F 3/227; G05F 3/24; G05F 3/242; G05F 3/245; G05F 3/247; G06F 1/3203; G06F 1/3206; G06F 1/3209–1/3225; G06F 1/3275

USPC ........................................................ 327/143
See application file for complete search history.

(56) References Cited

U.S. PATENT DOCUMENTS

| | | | | |
|---|---|---|---|---|
| 5,689,460 A | * | 11/1997 | Ooishi | G11C 5/143 327/530 |
| 9,621,032 B2 | | 4/2017 | Pan | |
| 2008/0224752 A1 | * | 9/2008 | Lee | G06F 1/3203 327/292 |
| 2013/0311799 A1 | * | 11/2013 | Fitzpatrick | G06F 1/3296 713/320 |
| 2017/0012523 A1 | * | 1/2017 | Pan | G11C 5/145 |
| 2017/0230041 A1 | * | 8/2017 | Kato | H01L 21/78 |

* cited by examiner

*Primary Examiner* — Patrick C Chen
(74) *Attorney, Agent, or Firm* — Dicke, Billig & Czaja, PLLC

(57) ABSTRACT

Methods of operating a voltage generation circuit, and apparatus configured to perform such methods, include applying a clock signal to an input of a voltage driver of a stage of the voltage generation circuit, connecting the voltage driver output to a first voltage node configured to receive a first voltage when the clock signal has a particular logic level and a voltage level of the voltage driver output is less than a threshold, connecting the voltage driver output to a second voltage node configured to receive a second voltage greater than the first voltage when the clock signal has the particular logic level and the voltage level of the voltage driver output is greater than the threshold, and connecting the voltage driver output to a third voltage node configured to receive a third voltage less than the first voltage when the clock signal has a different logic level.

3 Claims, 10 Drawing Sheets

METHODS AND APPARATUS FOR GENERATION OF VOLTAGES

TECHNICAL FIELD

The present disclosure relates generally to integrated circuits and, in particular, in one or more embodiments, the present disclosure relates to methods and apparatus for generation of voltages in integrated circuits, e.g., semiconductor memory.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Integrated circuit devices generally are powered by two or more externally-supplied voltages, such as Vcc and Vss. In addition to the supply voltages, integrated circuit devices often generate other voltages utilized in the operation of that device. For example, in a memory device, such internally-generated voltages are often utilized during access operations, such as during a read operation, a program operation (often referred to as a write operation), or an erase operation. The internally-generated voltages are often higher or lower than any supply voltage.

Generating other voltage levels from a supply voltage is often performed using a charge pump or other voltage generation circuit. Charge pumps often utilize alternating switched capacitances (e.g., capacitors) to generate a higher or lower voltage from a supply voltage. Power efficiency is often an important consideration in the design and usage of integrated circuit devices, and the generation and transmission of these internal voltages often results in significant power losses.

For the reasons stated above, and for other reasons stated below which will become apparent to those skilled in the art upon reading and understanding the present specification, there is a need in the art for alternative methods of generating and transmitting voltages, and apparatus to perform such methods.

DETAILED DESCRIPTION

Figure 1:
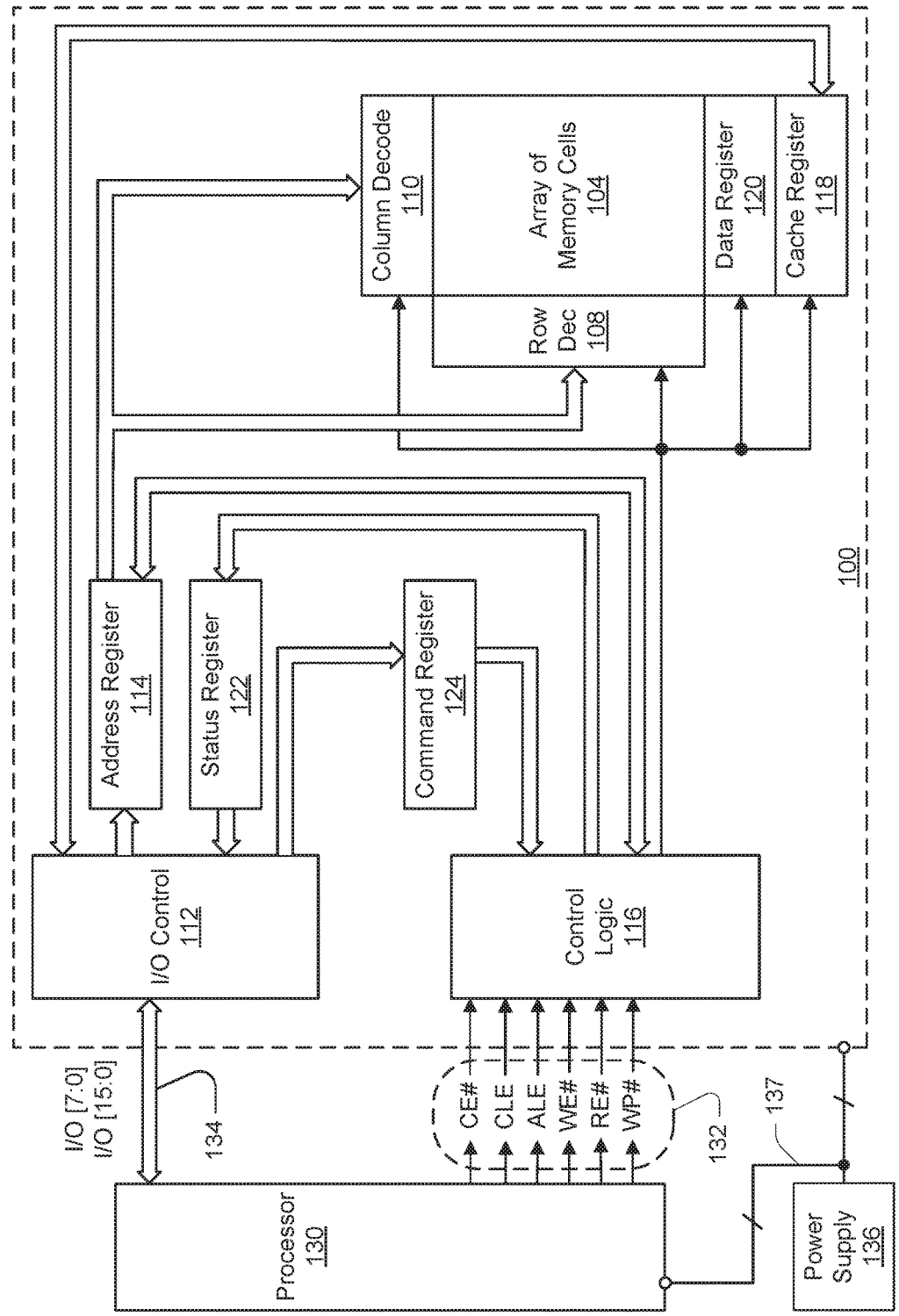
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

Voltage generation circuits typically increase or decrease an input supply voltage in order to provide a higher or lower output voltage, respectively, required to operate circuit elements in integrated circuits. A charge pump is one type of voltage generation circuit typically employed in integrated circuit devices such a non-volatile memory systems. A charge pump typically includes several stages which may each include a stage capacitance which is charged and discharged during a clock cycle of the charge pump by a voltage driver (e.g., a clocked voltage driver). A voltage isolation device may be coupled between the stage capacitance and the stage input voltage to mitigate loss of the developed output voltage of the stage, whether positive or negative.

One or more clock signals typically trigger the charging of the stage capacitances. A typical clock signal may have a clock frequency with a time period less than the discharge time of the capacitances. In one such design, two clock signals having opposite phase trigger the charging of alternate stages of a multi-stage charge pump.

Figure 7A:
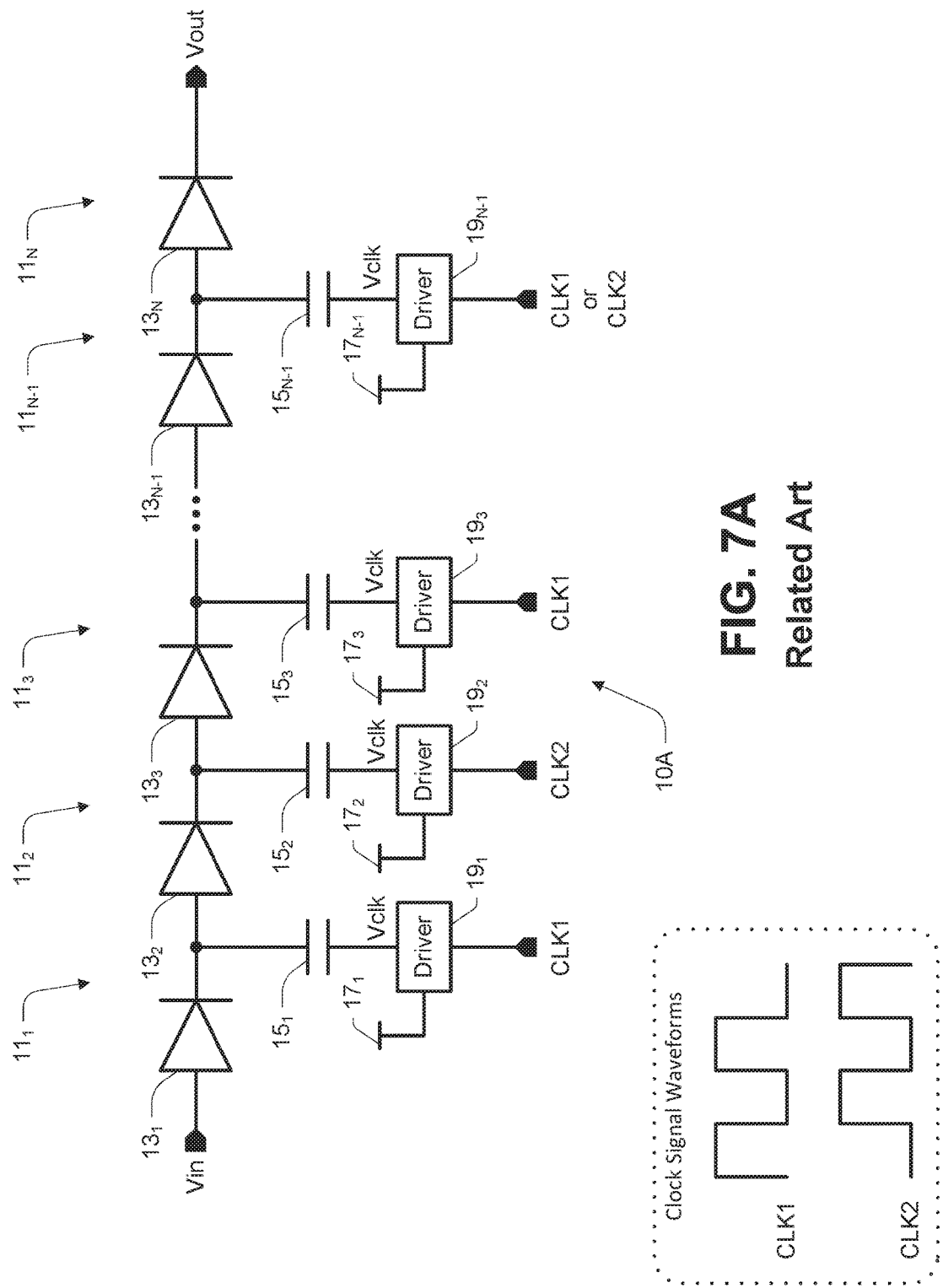
FIGS. 7A-7B are schematics of conventional voltage generation circuits.

An example of a conventional charge pump 10A is illustrated schematically in FIG. 7A as one example of a voltage generation circuit. Charge pump 10A may be a positive charge pump, e.g., developing an increasing voltage level at its output.

Charge pump 10A receives an input voltage Vin, which might be a supply voltage (e.g., Vcc) for example. A first clock signal CLK1 may be received by alternating stage voltage drivers (e.g., stage voltage drivers $19_1$, $19_3$, $19_5$, etc.) while a second clock signal CLK2 may be received by remaining alternating stage voltage drivers (e.g., stage voltage drivers $19_2$, $19_4$, $19_6$, etc.). While stage voltage drivers $19_4$, $19_5$ and $19_6$ are not directly shown in FIG. 7A, it is apparent from the numbering of stage voltage drivers 19 from 1 to N. Clock signals CLK1 and CLK2 would generally have different (e.g., opposite) phases and the same frequency.

Each stage voltage driver 19 is connected to receive a drive voltage from a respective drive voltage node 17. Each stage voltage driver 19 is configured to provide the voltage of its respective drive voltage node 17 (e.g., a supply voltage, such as Vcc or some other positive voltage) during a particular phase of its respective clock signal, and to provide a different voltage (e.g., a supply voltage, such as Vss, ground or other voltage lower than the voltage of its respective drive voltage node 17) during the other phase of its respective clock signal. For example, the output of each stage voltage driver 19 may take the same general waveform as its respective clock signal CLK1 or CLK2 (or a complement of its respective clock signal), although the amplitudes may differ. The output voltage (e.g., the voltage signal Vclk) of each stage voltage driver 19 is provided to one electrode of its respective stage capacitance 15.

Charge pump 10A may include N stages. The stages $11_1$ through $11_{N-1}$ may each include a stage capacitance 15 and a voltage driver 19. The stages $11_1$ through $11_{N-1}$ may further include a voltage isolation device 13, e.g., a diode. The Nth stage $11_N$ of the charge pump 10A may contain a voltage isolation device $13_N$ without a corresponding stage capacitance 15 or voltage driver 19. The voltage isolation device $13_N$ may be included to protect a load, e.g., circuitry configured to receive the output voltage Vout. In the charge pump 10A, the voltage isolation devices 13 may generally mitigate charge or discharge of the stage capacitances 15 between cycles of their respective clock signal CLK1 or CLK2. Thus, the charge pump 10A may progressively store more charge on the capacitance component of each stage, and several such stages connected in series in the charge pump 10A can produce an increasing voltage level.

Figure 7B:
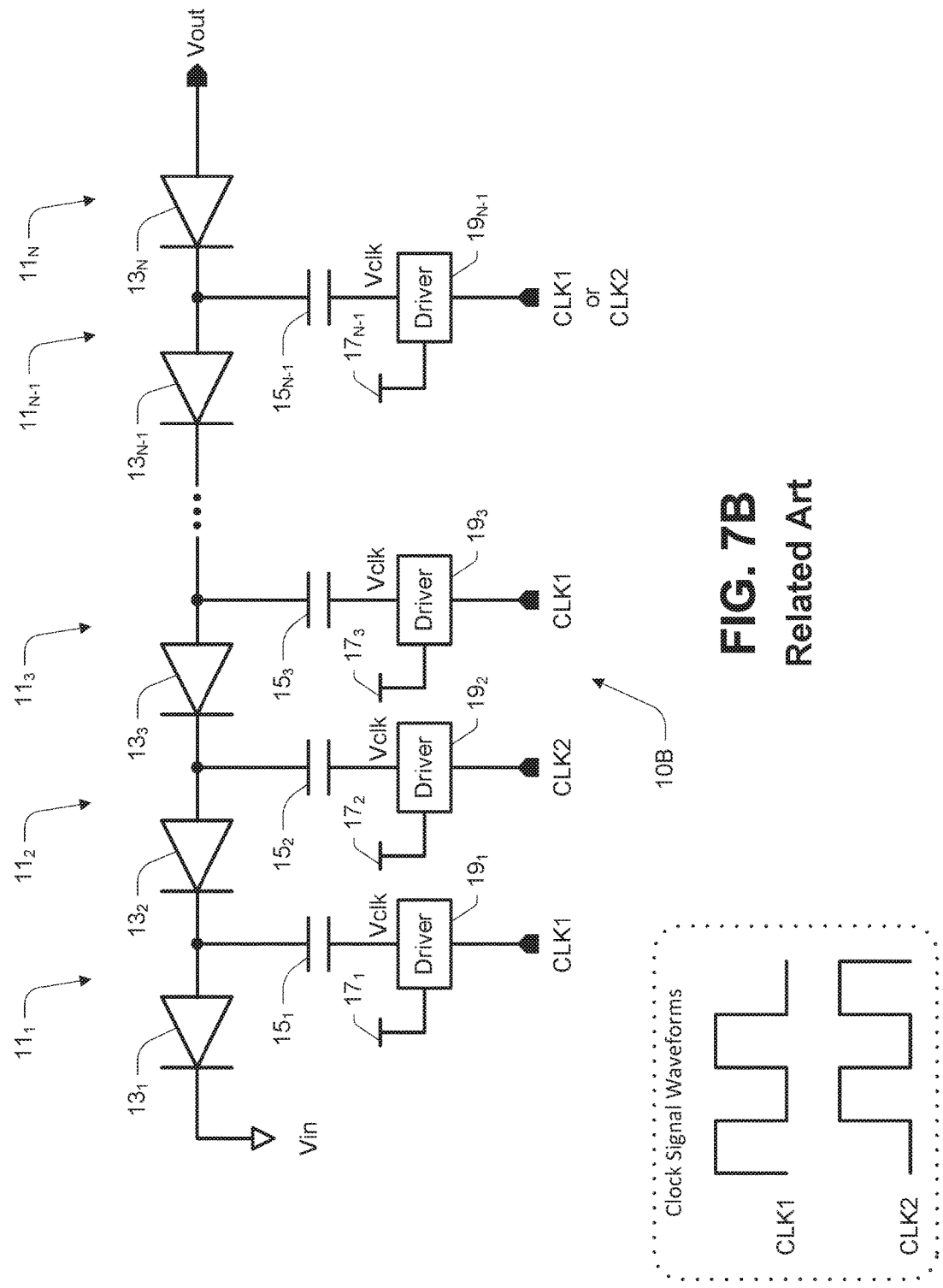

Another example of a conventional charge pump 10B is illustrated schematically in FIG. 7B as another example of a voltage generation circuit. Charge pump 10B may be a negative charge pump, e.g., developing a decreasing voltage level at its output. In general, the charge pump 10B has the same structure as the charge pump 10A, except that its voltage isolation devices 13 are connected to be forward biased when their corresponding stage capacitance 15 is receiving the drive voltage instead of reverse biased as in the charge pump 10A. For example, in the charge pump 10A, the voltage isolation device $13_1$ is reversed biased, and the voltage isolation device $13_2$ is forward biased, when the voltage driver $19_1$ is providing the drive voltage to the electrode of stage capacitance $15_1$, and thus charging the stage capacitance $15_1$. In contrast, in the charge pump 10B, the voltage isolation device $13_1$ is forward biased, and the voltage isolation device $13_2$ is reverse biased, when the voltage driver $19_1$ is providing the drive voltage to the electrode of stage capacitance $15_1$, and thus charging the stage capacitance $15_1$. In addition, in the charge pump 10B, the input voltage Vin may be a reference voltage, such as ground, Vss or 0V, for example. Other configurations of charge pump stages are known.

Figure 8:
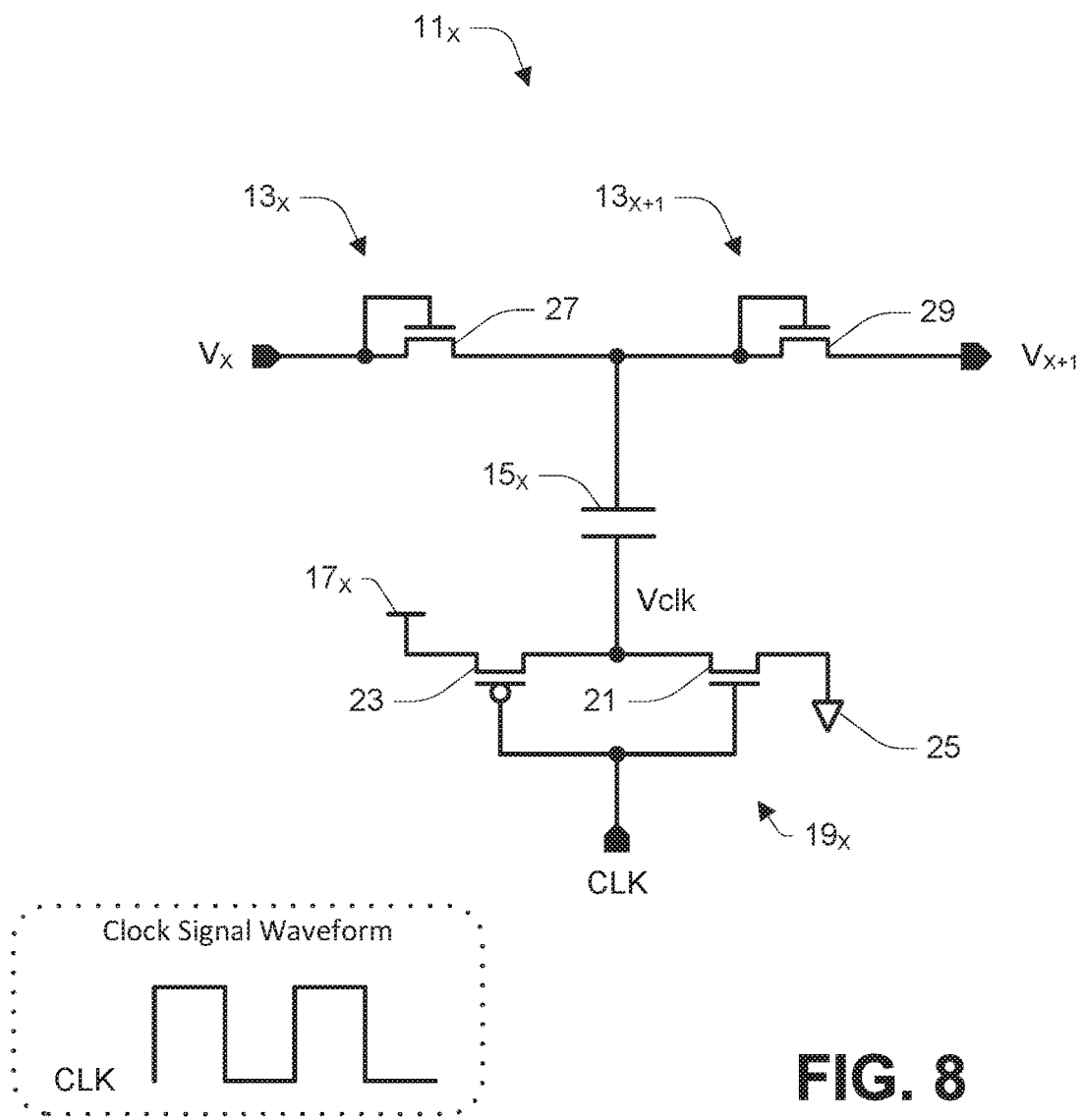
FIG. 8 is a schematic of a stage of a conventional voltage generation circuit.

FIG. 8 is a schematic of a stage $11_X$ shown in additional detail. In the example of FIG. 8, the voltage isolation device $13_X$ for stage $11_X$ is depicted to be a diode-connected n-type field effect transistor (nFET) 27. Similarly, the voltage isolation device $13_{X+1}$ of the subsequent stage (not shown) is depicted to be a diode-connected nFET 29. Other voltage isolation device structures are known, and embodiments described herein are not dependent upon a type of voltage isolation device chosen.

The voltage driver $19_X$ is depicted to be an inverter having an nFET 21 and a p-type field effect transistor (pFET) 23 connected in series between the drive voltage node $17_X$ (e.g., configured to receive the drive voltage) and a reference node 25 (e.g., configured to receive some voltage different, e.g., lower, than the drive voltage), and each connected to receive the clock signal CLK at their gate. One (e.g., first) electrode of the stage capacitance $15_X$ is connected to receive the output voltage of the inverter, e.g., the output voltage Vclk. The other (e.g., second) electrode of the stage capacitance $15_X$ is connected between the voltage isolation devices $13_X$ and $13_{X+1}$, i.e., to the input of one and the output of the other. In this particular example, the second electrode of the stage capacitance $15_X$ is connected to the output of the diode-connected nFET 27 and the input of the diode-connected nFET 29.

While the foregoing voltage generation devices (e.g., charge pumps 10A and 10B) may be used as a standalone N-stage voltage generation device as depicted in FIGS. 7A and 7B, certain advantages may be facilitated by cascading voltage generation devices. For example, the charge pumps 10A and 10B were described to be able to use the supply voltage Vcc as a drive voltage to its voltage drivers 19, but output voltages of higher magnitude, higher or lower, can be obtained by increasing the magnitude of the drive voltage. Thus, a first voltage generation device (e.g., of the type depicted in FIG. 7A) might be configured to use the supply voltage Vcc as the drive voltage for its voltage drivers to develop an elevated voltage Vkk as its output voltage, and the output voltage of the first voltage generation device might be provided to a second voltage generation device as both the input voltage of the second voltage generation device and the drive voltage for voltage drivers (e.g., each of the voltage drivers) of the second voltage generation device. Such cascading of voltage generation devices may be repeated using more than two voltage generation devices, with subsequent voltage generation devices receiving the output voltage of a preceding (e.g., immediately preceding) voltage generation device as both the input voltage of the subsequent voltage generation device and the drive voltage for voltage drivers (e.g., each of the voltage drivers) of the subsequent voltage generation device. The second (or final) voltage generation device in such a cascaded arrangement might be a positive or a negative voltage generation device.

Figure 9A:
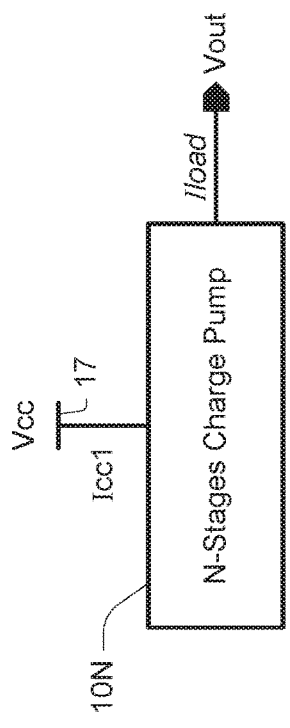
FIGS. 9A-9B are simplified block diagrams of an N-stages charge pump and cascaded K-stages and M-stages charge pumps for comparison of current efficiencies.
Figure 9B:
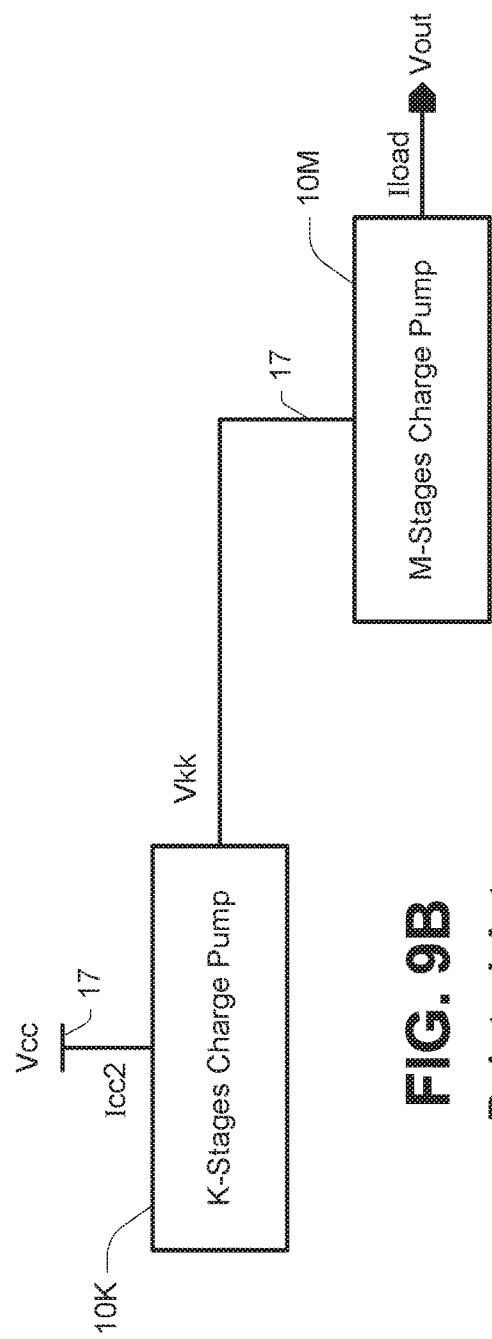

While cascading voltage generation devices might provide for output voltages having higher magnitudes, there are typically inefficiencies. Consider the example N-stages charge pump 10N in FIG. 9A and the example cascading of K-stages charge pump 10K and M-stages charge pump 10M in FIG. 9B. At the same Vout, and the same current load at the output (Iload), the relationship between Icc2 and Icc1 might be represented by the Equation 1 for a positive charge pump and by the Equation 2 for a negative charge pump. Note that for a negative Vout, the K-stages charge pump 10K may be a positive charge pump and the M-stages charge pump 10M may be a negative charge pump.

$$Icc2 > Iload*(M+1)*(K+1) > Icc1 \qquad \text{Eq. 1}$$

$$Icc2 > Iload*(M)*(K+1) > Icc1 \qquad \text{Eq. 2}$$

Various embodiments herein seek to mitigate this current draw of cascaded voltage generation devices. In particular, voltage drivers of stages of various embodiments receive multiple drive voltages, and include logic to selectively apply one or the other to the stage capacitance during a particular logic level of the clock signal, and to otherwise apply a different, e.g., lower, voltage. The additional drive voltage may be received from an output of a prior voltage generation device, and the logic of the voltage driver may be configured to utilize a supply voltage (e.g., Vcc) as the drive voltage while the output of the voltage driver is below a threshold and the clock signal has the particular logic level, and to utilize a generated (e.g., higher) voltage as the drive voltage while the output of the voltage driver is above the threshold and the clock signal has the particular logic level. Various embodiments will be described in relation to their use in memory. However, embodiments may be used in any integrated circuit utilizing voltage generation circuits.

FIG. 1 is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., read operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 and/or processor 130 may receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more voltage supply nodes 137, such as a supply voltage node (e.g., Vcc) and a reference voltage node (e.g., Vss, ground or 0V). It is not uncommon for a power supply 136 to provide more than two voltage supply nodes 137. For simplicity, distribution of power from the voltage supply nodes 137 to components within the memory device 100 is not depicted.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
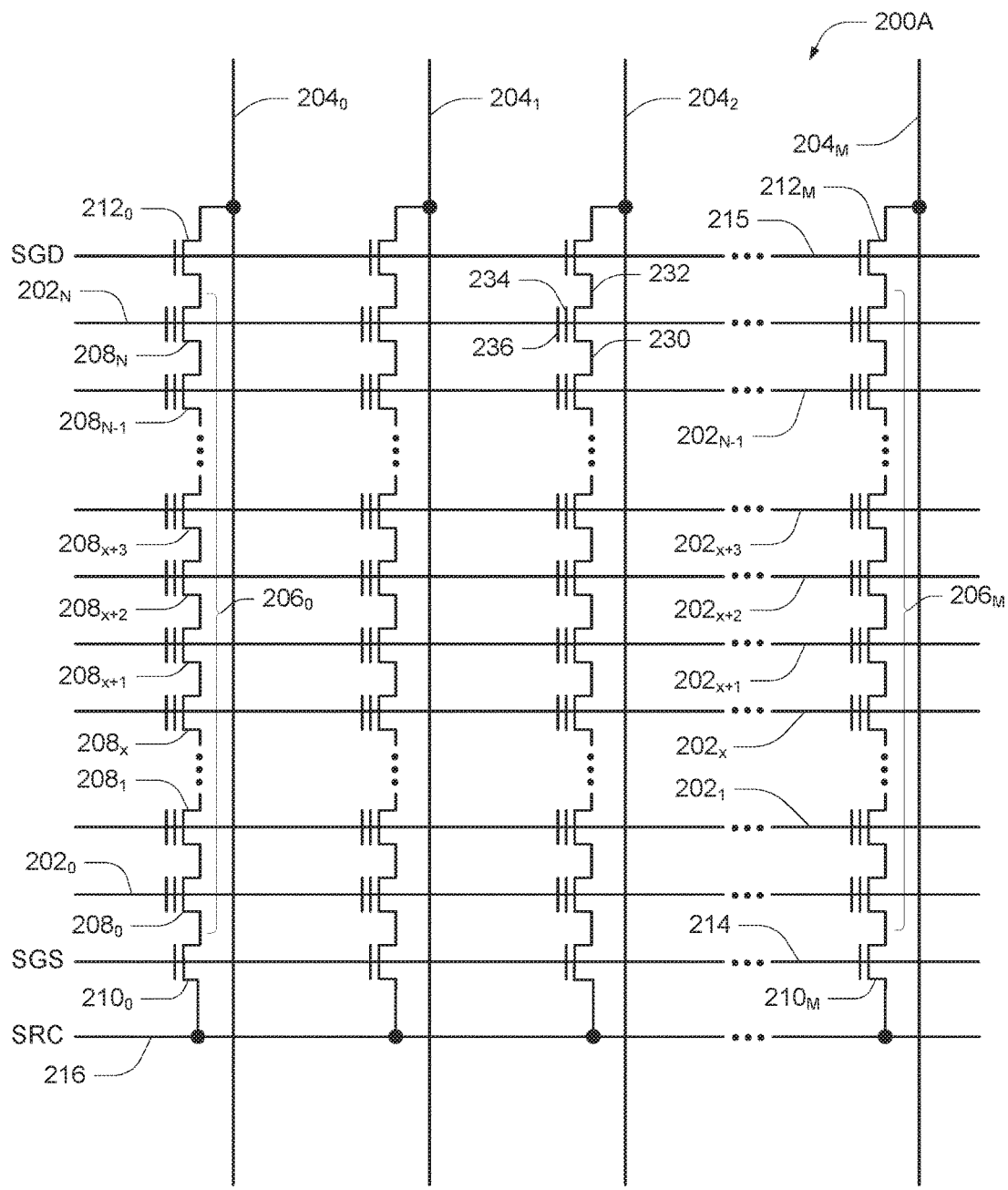
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. An array of memory cells, such as memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The array of memory cells in FIG. 2A might be a three-dimensional array of memory cells, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) an access line, e.g., a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells.

The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
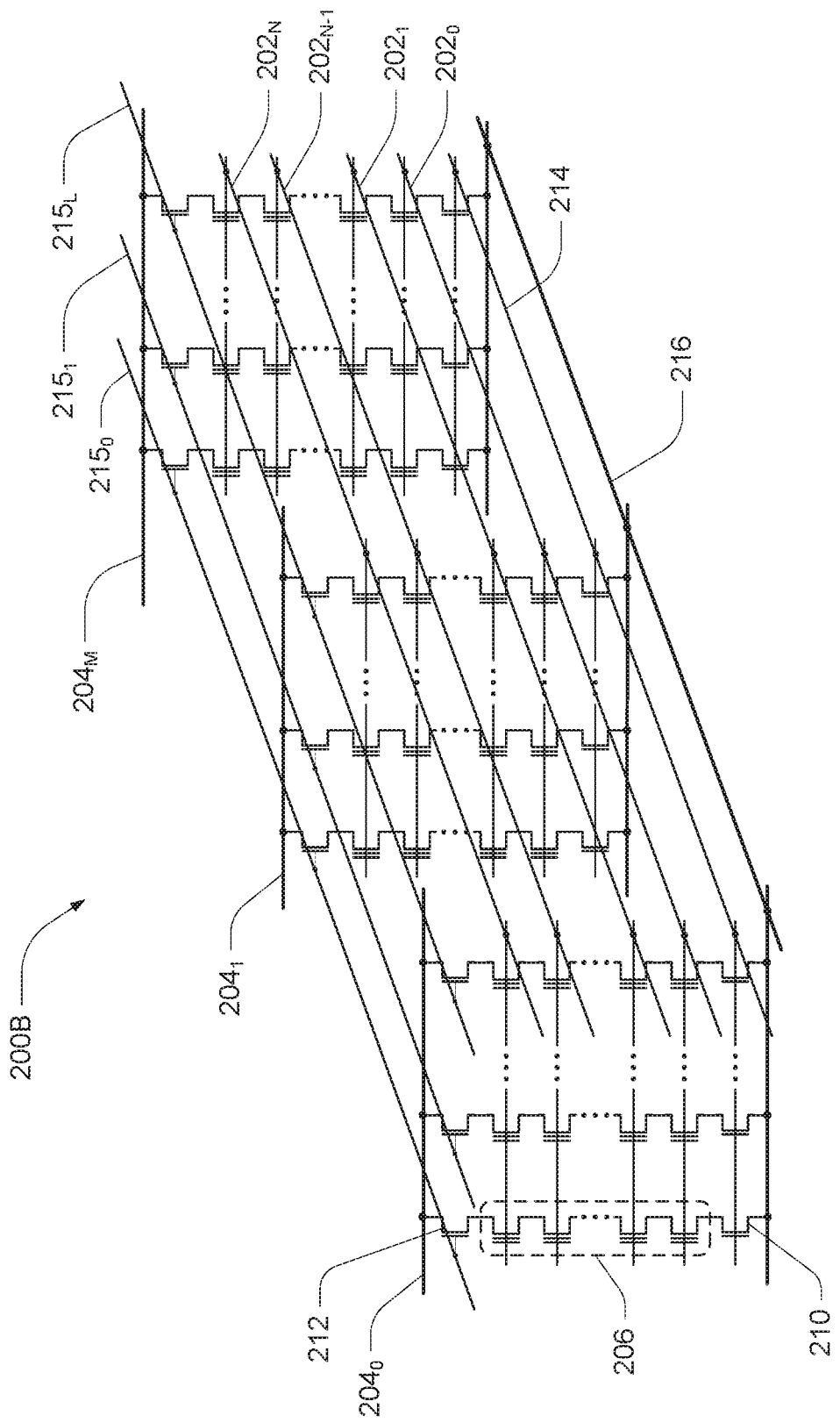

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional array of memory cells having a NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 1 and 2A-2B were discussed in conjunction with NAND flash, the embodiments described herein are not limited to use with a particular array architecture or structure, and can include other structures (e.g., cross-point memory, DRAM, etc.) and other architectures (e.g., AND arrays, NOR arrays, etc.), and may further be used in other integrated circuit devices in general.

Figure 3:
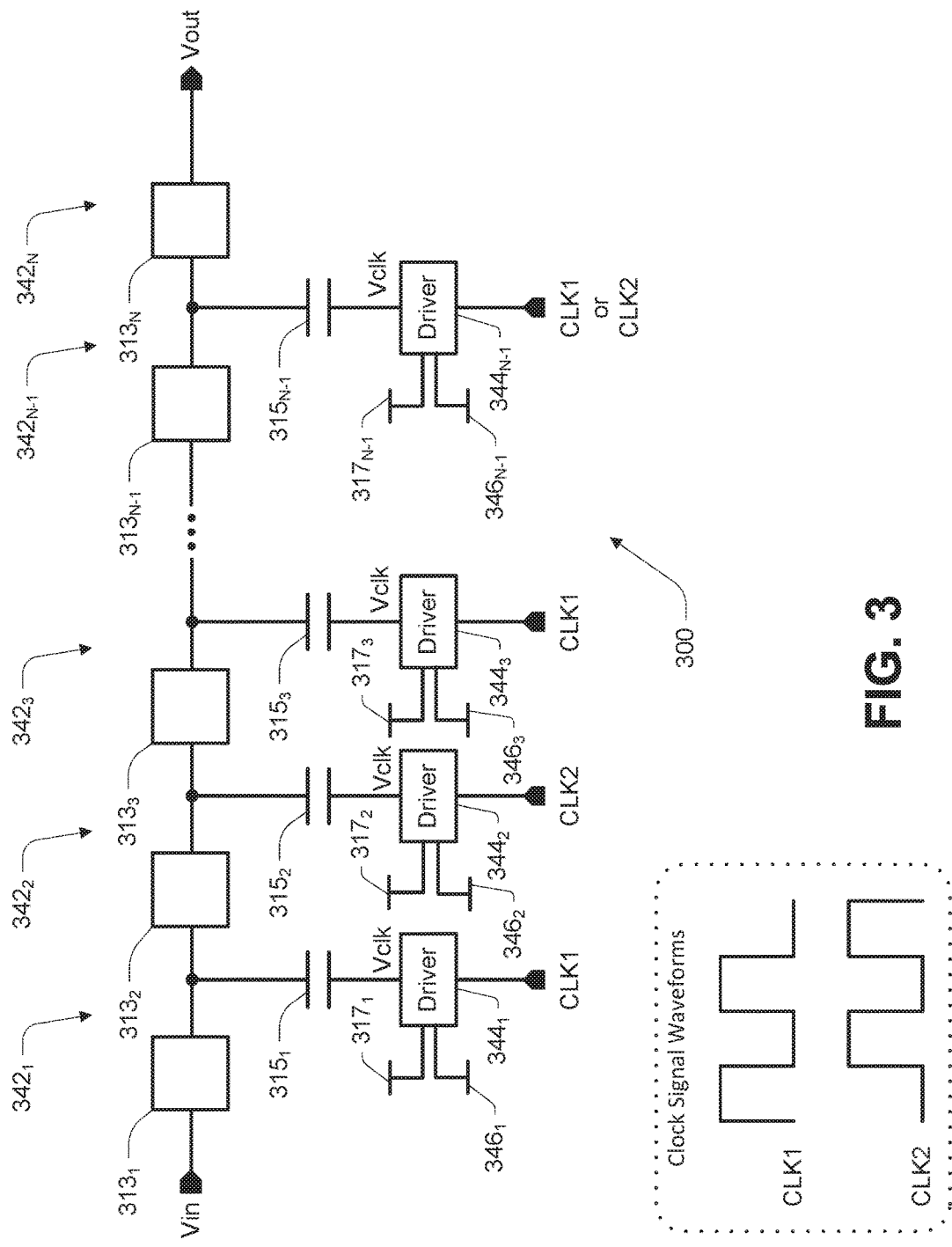
FIG. 3 is a schematic of a voltage generation circuit in accordance with an embodiment.

FIG. 3 is a schematic of a voltage generation circuit 300 in accordance with an embodiment. Voltage generation circuit 300 may include one or more stages 342, e.g., stages 1 through N-1, where N is some integer equal to or greater than two. Voltage generation circuit 300 may further include a voltage isolation device 313 as an Nth stage $342_N$. Multiple stages 342 may be connected in series, such as described with reference to FIG. 7A. The voltage generation circuit 300 may be a positive or negative charge pump, for example.

As described with reference to FIGS. 7A and 7B, each stage 342 might include a stage capacitance 315 and a voltage isolation device 313. The voltage isolation devices 313 may generally mitigate charge or discharge of the stage capacitances 315 between cycles of their respective clock signal CLK1 or CLK2. For a positive charge pump, a voltage isolation device 313 of a stage 342 may have a structure suitable for mitigating current flow to a prior stage 342 when the stage capacitance 315 is receiving the drive voltage, and for facilitating current flow from the prior stage 342 when the stage capacitance 315 of the prior stage 342 is receiving the drive voltage. As one example, the voltage isolation devices 313 for a positive charge pump may be diodes configured to the reversed biased when their stage capacitance 315 is receiving the drive voltage. For a negative charge pump, a voltage isolation device 313 of a stage 342 may have a structure suitable for facilitating current flow to a prior stage 342 when the stage capacitance 315 is receiving the drive voltage, and for mitigating current flow from the prior stage 342 when the stage capacitance 315 of the prior stage 342 is receiving the drive voltage. As one example, the voltage isolation devices 313 for a negative charge pump may be diodes configured to the forward biased when their stage capacitance 315 is receiving the drive voltage.

Charge pump 300 receives an input voltage Vin, which might be a generated voltage, e.g., an output voltage of a prior voltage generation circuit. A first clock signal CLK1 may be received at one input of alternating voltage drivers 344, e.g., voltage drivers $344_1$, $344_3$, $344_5$, etc., while a second clock signal CLK2 may be received at one input of alternating voltage drivers, e.g., voltage drivers $344_2$, $344_4$, $344_6$, etc. While stage capacitances $344_4$, $344_5$ and $344_6$ are not directly shown in FIG. 3, it is apparent from the numbering of voltage drivers 344 from 1 to N. Clock signals CLK1 and CLK2 would generally have opposite phases and similar (e.g., the same) amplitudes, such as described with reference to FIGS. 7A-7B.

A (e.g., each) voltage driver 344 may also be connected to a first voltage node 317. Each first voltage node 317 may be configured to receive a supply voltage, such as Vcc, that may be from an external power supply. A (e.g., each) voltage driver 344 may also be connected to a second voltage node 346. Each second voltage node 346 may be configured to receive a second (e.g., generated) voltage, such as an output voltage of a prior voltage generation circuit (e.g., charge pump). As an example, the second voltage node 346 may be configured to receive the same voltage as the input voltage Vin, or some other voltage greater than the voltage of the first voltage node 317.

A (e.g., each) voltage driver 344 may include logic responsive to its respective clock signal and its respective output voltage (Vclk) to select one of the voltage of the first voltage node 317 or the voltage of the second voltage node 346 for its output when its respective clock signal has a first logic level, and to isolate both the first voltage node 317 and the second voltage node 346 from its output when its respective clock signal has a second logic level different than the first logic level. For example, a (e.g., each) voltage driver 344 may be configured to select the voltage of the first voltage node 317 for its output when its respective clock signal has the first logic level and the voltage level of the output voltage (Vclk) of that voltage driver is less than a threshold, to select the voltage of the second voltage node 346 for its output when its respective clock signal has the first logic level and the voltage level of the output voltage (Vclk) of that voltage driver is greater than the threshold, and to apply a voltage of a reference node when its respective clock signal has a second logic level different than the first logic level. Voltage levels of the output voltage (Vclk) of a voltage driver may result in the selection of either the voltage of the first voltage node 317 or the voltage of the second voltage node 346.

Figure 4:
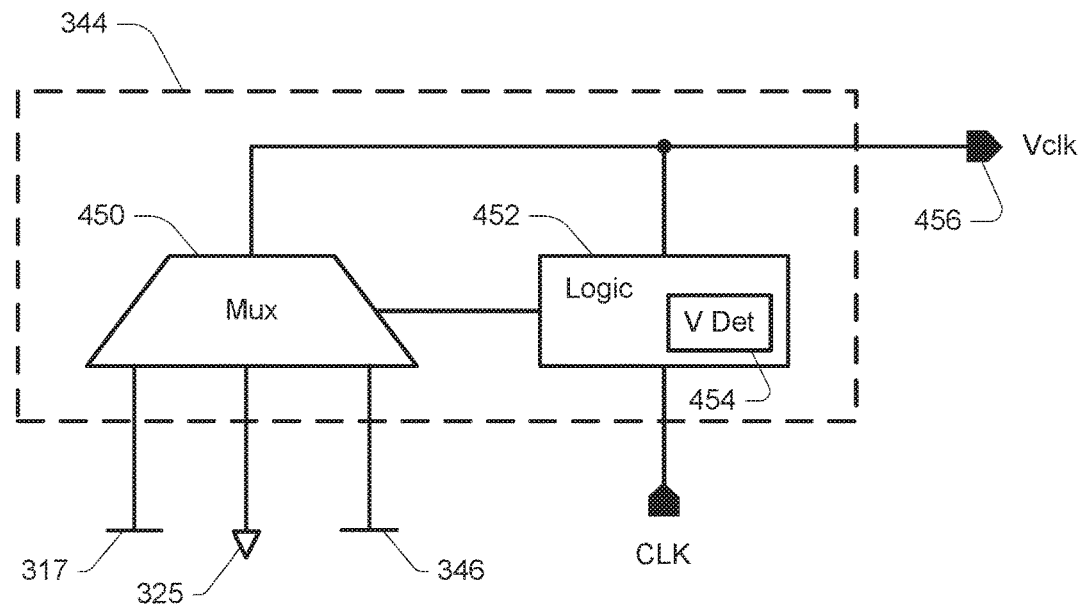
FIG. 4 is a schematic of a voltage driver in accordance with an embodiment.

FIG. 4 is a schematic of a voltage driver 344 in accordance with an embodiment. The voltage driver 344 of FIG. 4 may include a multiplexer 450 having a first input connected to the first voltage node 317 configured to receive a first voltage, such as a positive supply voltage. A second input of the multiplexer 450 may further be connected to a second voltage node 346 to receive a second voltage greater than the first voltage. A third input of the multiplexer 450 may further be connected to a third voltage node 325 to receive a third voltage less than the first voltage. For example, the third voltage may be a reference voltage, such as Vss, ground or 0V.

The multiplexer 450 is responsive to control signals from the logic 452. The logic 452 may include a voltage detector 454 to provide a control signal indicative of whether the output voltage Vclk is greater than, or less than, a threshold. The threshold may be some voltage level less than or equal to a voltage level of the first voltage. The logic 452 may be further responsive to the clock signal CLK. In response to the control signals from the logic 452, the multiplexer 450 selects one of the voltage nodes 317, 325 or 346 for connection to the output 456 of the voltage driver 344.

Figure 5:
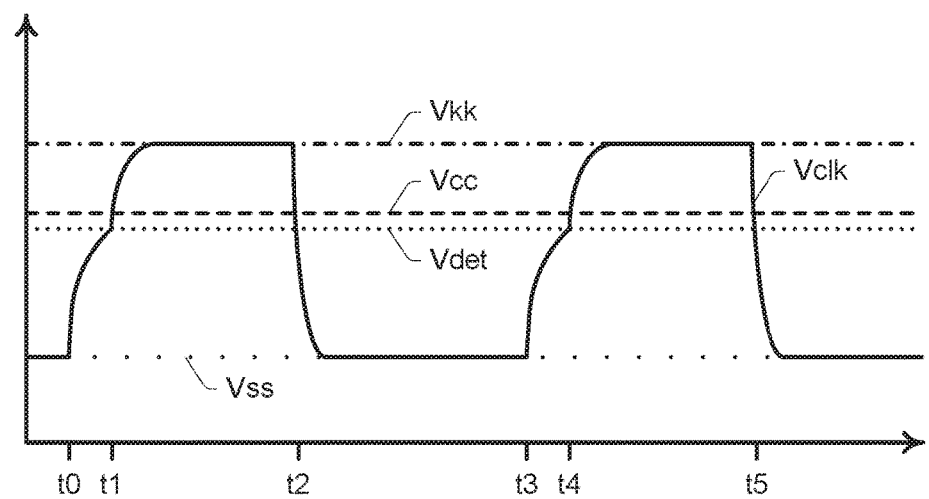
FIG. 5 is a waveform of an output voltage of a voltage driver in accordance with an embodiment.

FIG. 5 is a waveform of an output voltage Vclk of a voltage driver 344 of the type depicted in FIG. 4 in accordance with an embodiment. Consider the example where the first voltage node 317 is configured to receive the supply voltage Vcc, the second voltage node 346 is configured to receive the generated voltage Vkk greater than Vcc, the third voltage node 325 is configured to receive the reference voltage Vss, and the threshold is the voltage Vdet. In this example, at time t0, when the clock signal CLK has a particular logic level (e.g., a first logic level), the voltage driver 344 connects the voltage node 317 to the output 456, and the voltage level of the output voltage Vclk begins to increase from Vss toward Vcc. At time t1, as the output voltage Vclk reaches or becomes greater than the threshold Vdet, the voltage driver 344 connects the voltage node 346 to the output 456, and the voltage level of the output voltage Vclk continues to increase toward Vkk. At time t2, when the clock signal CLK has a different logic level (e.g., a second logic level), which may be opposite of the particular logic level, the voltage driver 344 connects the voltage node 325 to the output 456, and the voltage level of the output voltage Vclk begins to decrease toward Vss. This cycle may then be repeated at times t3, t4 and t5 during the next cycle of the clock signal CLK.

In general, Vdet might be selected to be equal to or less than the voltage level of the first voltage node 317. It is expected that values of Vdet closer to the voltage level of the first voltage node 317 might lead to higher efficiencies. However, values of Vdet between the voltage level of the third voltage node 325 and the first voltage node 317 might facilitate improvements over cascaded voltage generation circuits utilizing conventional voltage drivers.

Figure 6:
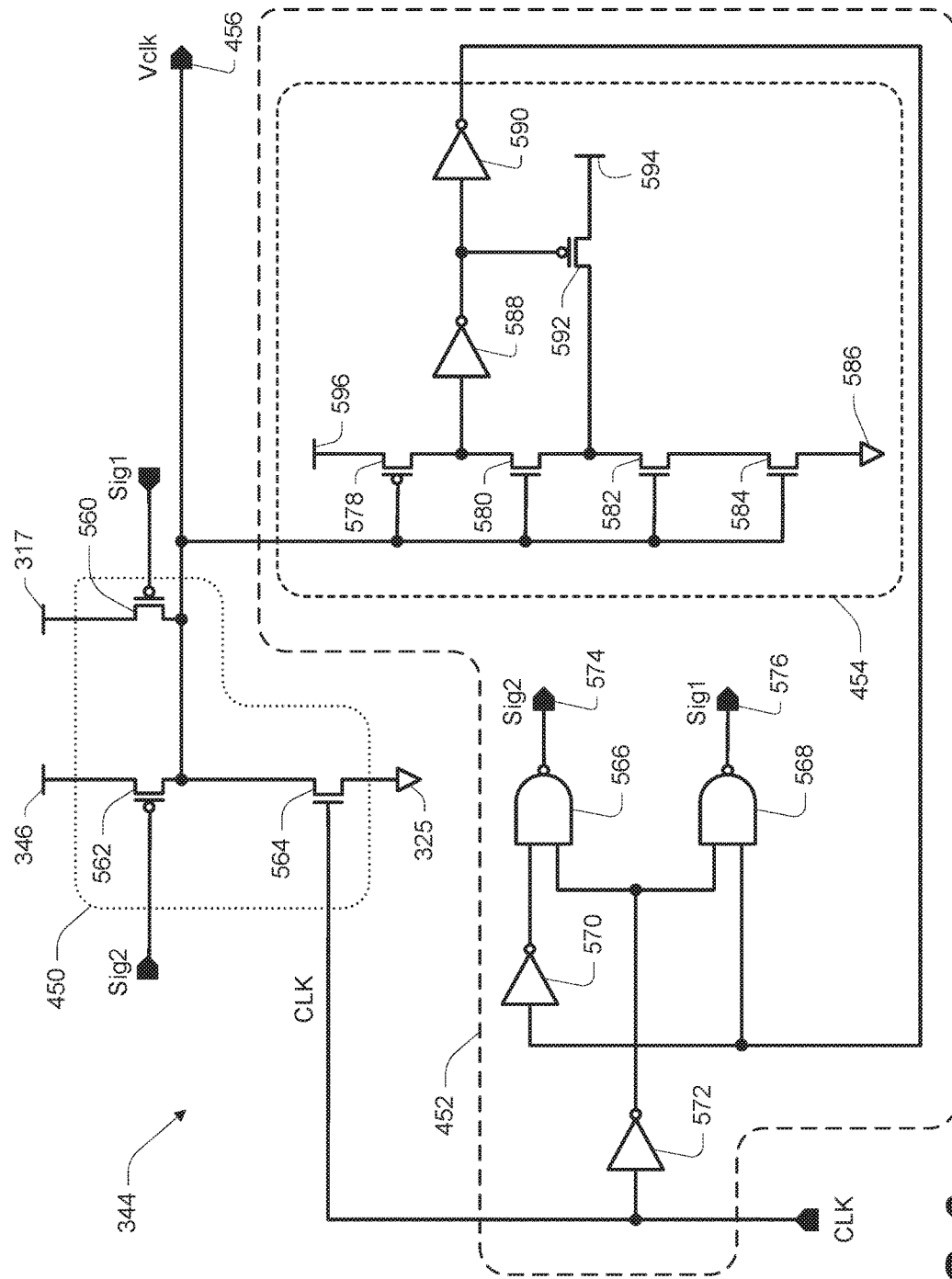
FIG. 6 is a schematic of a voltage driver in accordance with another embodiment.

FIG. 6 is a schematic of a voltage driver 344 in accordance with another embodiment depicting one implementation of the multiplexer 450, the logic 452 and the voltage detector 454. In particular, the multiplexer 450 may include a first gate, such as a pFET 560, connected between the first voltage node 317 and the output 456. The multiplexer 450 may further include a second gate, such as a pFET 562 connected between the second voltage node 346 and the output 456. The multiplexer 450 may further include a third gate, such as an nFET 564 connected between the third voltage node 325 and the output 456. The first gate, second gate and third gate of the multiplexer 450 may be connected in parallel.

The voltage detector 454 may include a first pFET 578 and a first nFET 580 connected in series between a voltage node 596 and a voltage node 586. The voltage node 596 may be connected to receive a voltage greater than a voltage of which the voltage node 586 is connected to receive. For example, the voltage node 596 may be connected to receive the first voltage of which the voltage node 317 is connected to receive, and the voltage node 586 may be connected to receive the third voltage of which the voltage node 325 is connected to receive. The voltage detector 454 may further include one or more additional nFETs, such as second nFET 582 and third nFET 584, connected in series between the first nFET 580 and the voltage node 586.

The voltage detector 454 may further include a first inverter 588 having an input connected between the first pFET 578 and the first nFET 580 (e.g., to a source/drain between the first pFET 578 and the first nFET 580), and having an output connected to an input of a second inverter 590. The voltage detector 454 may further include a second pFET 592 having a gate connected to the output of the first inverter 588, a first source/drain connected between the first nFET 580 and the second nFET 582 (e.g., to a source/drain between the first nFET 580 and the second nFET 582), and a second source/drain connected to a voltage node 594. The voltage node 594 may be connected to receive a voltage greater than a voltage of which the voltage node 586 is connected to receive. For example, the voltage node 596 may be connected to receive the first voltage of which the voltage node 317 is connected to receive. The gates of the first pFET 578, first nFET 580, second nFET 582, and third nFET 584 may be commonly connected to the output 456.

The voltage detector 454 may be expected to provide a control signal at the output of the second inverter 590 indicative of whether or not the output voltage Vclk is greater than (or greater than or equal to) the threshold. Where the voltage nodes 594 and 596 are connected to receive the supply voltage Vcc, and the voltage node 586 is connected to receive the reference voltage Vss, the circuit described with reference to FIG. 6 may facilitate detection of a threshold equal to (e.g., substantially equal to) the supply voltage Vcc minus the absolute value of a pFET threshold voltage, such as the threshold voltage of the first pFET 578 or second pFET 592. For example, the voltage detector 454 may provide a control signal having a logic high level while the output voltage Vclk is less than the threshold, and provide a control signal having a logic low level while the output voltage Vclk is greater or equal to the threshold.

The logic 452 may include a first inverter 570 having an input connected to the output of the inverter 590 of the voltage detector 454, and having an output connected to a first input of a first NAND gate 566. The logic 452 may further include a second inverter 572 having an input connected to receive the clock signal CLK, and having an output connected to a second input of the first NAND gate 566 and connected to a first input of a second NAND gate 568. A second input of the second NAND gate 568 may be connected to the output of the inverter 590 of the voltage detector 454. The first NAND gate 566 has an output 574 connected to the gate of the pFET 562 of the multiplexer 450. The second NAND gate 568 has an output 576 connected to the gate of the pFET 560 of the multiplexer 450. The gate of the nFET 564 of the multiplexer 450 may be connected to the input of the second inverter 572.

In the circuit described with reference to FIG. 6, the voltage driver 344 might connect the first voltage node 317 to the output 456 when the clock signal CLK has a logic low level and the output voltage Vclk is less than the threshold, e.g., the threshold determined by the voltage detector 454. The voltage driver 344 might connect the second voltage node 346 to the output 456 when the clock signal CLK has the logic low level and the output voltage Vclk is greater than (e.g., greater than or equal to) the threshold. And the voltage driver 344 might connect the third voltage node 325 to the output 456 when the clock signal CLK has a logic high level, e.g., regardless of the level of the output voltage Vclk.

As previously noted, there may be certain inefficiencies inherent in utilizing the output voltage of a first voltage generation circuit as both the input voltage and the drive voltage for a second voltage generation circuit in a cascaded voltage generation system. Utilizing a different voltage source, e.g., a supply voltage, for a portion of the clock cycle as described herein may facilitate a mitigation of a portion of those inefficiencies. Referring back to Equations 1 and 2 described with reference to FIGS. 9A-9B, and applying a voltage driver in accordance with an embodiment, the reductions in current requirements might be represented by the Equation 3 for a positive charge pump and Equation 4 for a negative charge pump. In Equations 3 and 4, k is the number of stages of a first charge pump using conventional voltage drivers with the supply voltage Vcc as an input voltage and a drive voltage; m is the number of stages of a second charge pump cascaded with the k-stages charge pump and using conventional voltage drivers with the output voltage of the k-stages charge pump as an input voltage and as a drive voltage; K is the number of stages of a first charge pump using conventional voltage drivers with the supply voltage Vcc as an input voltage and as a drive voltage; and M is the number of stages of a second charge pump cascaded with the K-stages charge pump and using voltage drivers in accordance with embodiments, with the output voltage of the K-stages charge pump as an input voltage and as a drive voltage when the output voltage of a voltage driver is greater than a threshold and the clock signal has a particular logic level, and with the supply voltage Vcc as a drive voltage when the output voltage of the voltage driver is less than the threshold and the clock signal has the particular logic level.

$$Icc \approx Iload*(M+1)*((Vdet/Vkk)+((K+1)*(Vkk-Vdet)/Vkk)) < Iload*(m+1)*(k+1) \quad \text{Eq. 3}$$

$$Icc \approx Iload*(M)*((Vdet/Vkk)+((K+1)*(Vkk-Vdet)/Vkk)) < Iload*(m)*(k+1) \quad \text{Eq. 4}$$

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A voltage generation system, comprising:
   a first voltage generation circuit, the first voltage generation circuit comprising:
      an input;
      an output; and
      a first plurality of stages between the input and the output of the first voltage generation circuit, wherein a stage of the first plurality of stages comprises:
         a first voltage isolation device;
         a first voltage driver having a first input connected to a first voltage node configured to receive a first voltage, a second input connected to a second voltage node configured to receive a second voltage less than the first voltage, and a third input configured to receive a first clock signal;
         a first stage capacitance having a first electrode connected to an output of the first voltage driver and a second electrode connected to the first voltage isolation device;
         wherein the first voltage driver is configured to connect its output to the first voltage node when the clock signal has a particular logic level; and
         wherein the first voltage driver is further configured to connect its output to the second voltage node when the clock signal has a different logic level; and
   a second voltage generation circuit, the second voltage generation circuit comprising:
      an input connected to the output of the first voltage generation circuit;
      an output; and
      a second plurality of stages between the input and the output of the second voltage generation circuit, wherein a stage of the second plurality of stages comprises:
         a second voltage isolation device;
         a second voltage driver having a first input connected to a first voltage node configured to receive the first voltage, a second input connected to the output of the first voltage generation circuit, a third input connected to a third voltage node configured to receive the second voltage, and a fourth input configured to receive a second clock signal;
         a second stage capacitance having a first electrode connected to an output of the second voltage driver and a second electrode connected to the second voltage isolation device;
         wherein the second voltage driver is configured to connect its output to its first voltage node when the second clock signal has a particular logic level and a voltage level of its output is less than a threshold;
         wherein the second voltage driver is further configured to connect its output to the output of the first voltage generation circuit when the second clock signal has its particular logic level and the voltage level of its output is greater than the threshold; and
         wherein the second voltage driver is further configured to connect its output to its third voltage node when the second clock signal has a different logic level.

2. The voltage generation system of claim 1, wherein the first voltage generation circuit and the second voltage generation circuit are each configured to generate an increasing voltage at their respective output.

3. The voltage generation system of claim 1, wherein the first voltage generation circuit is configured to generate an increasing voltage at its respective output, and wherein the second voltage generation circuit is configured to generate a decreasing voltage at its output.

* * * * *